US007594211B1

United States Patent
Tian et al.

(10) Patent No.: US 7,594,211 B1
(45) Date of Patent: Sep. 22, 2009

(54) METHODS AND APPARATUSES FOR RESET CONDITIONING IN INTEGRATED CIRCUITS

(75) Inventors: Bing Tian, San Jose, CA (US); Kenneth S. McElvain, Menlo Park, CA (US)

(73) Assignee: Synopsys, Inc., Mountain View, CA (US)

( * ) Notice: Subject to any disclaimer, the term of this patent is extended or adjusted under 35 U.S.C. 154(b) by 132 days.

(21) Appl. No.: 11/601,411

(22) Filed: Nov. 17, 2006

(51) Int. Cl.
  *G06F 17/50* (2006.01)
(52) U.S. Cl. ............... 716/6; 716/1; 716/2; 716/17
(58) Field of Classification Search ............ 716/1, 716/2, 6, 17
  See application file for complete search history.

(56) References Cited

U.S. PATENT DOCUMENTS 6,446,249 B1 * 9/2002 Wang et al. ............ 716/17
6,970,115 B1 * 11/2005 Sardi et al. ............ 341/100

* cited by examiner

Primary Examiner—Thuan Do
(74) Attorney, Agent, or Firm—Blakely, Sokoloff, Taylor & Zafman LLP

(57) ABSTRACT

Embodiments of the present invention disclose methods and apparatuses to reduce metastability problem related to propagation delay of reset signals in integrated circuits, with preferred applications in automatic physical synthesis for RTL (register transfer level) netlist. In an embodiment, a reset conditioning circuit is inserted into the original integrated circuit to make the reset behavior more reliable to avoid unpredictable states, especially for the de-assertion state of the reset signal. The reset conditioning circuit can provide an asynchronous reset signal output with extended duration so that all the load registers employing asynchronous reset signal will get the reset properly. Further, the reset conditioning circuit can modify the timing of the reset signal so that its de-assertion edge is synchronized with a rising clock edge. In another embodiment, the reset conditioning circuit replicates a synchronous reset signal to provide a reset signal closer to loads or registers at a plurality of circuit modules or partitions. The generation of the reset conditioning circuit is well suitable for physical synthesis of RTL netlists, especially for automatic physical synthesis.

30 Claims, 7 Drawing Sheets

METHODS AND APPARATUSES FOR RESET CONDITIONING IN INTEGRATED CIRCUITS

FIELD OF THE INVENTION

The field of invention relates generally to electronic circuit design, and more specifically, to a method and apparatus for conditioning one or more reset signals, particularly for physical synthesis implementations.

BACKGROUND OF THE INVENTION

For the design of digital circuits on the scale of VLSI (very large scale integration) technology, designers often employ computer aided techniques. Standard languages such as Hardware Description Languages (HDLs) have been developed to describe digital circuits to aide in the design and simulation of complex digital circuits. Several hardware description languages, such as VHDL and Verilog, have evolved as industry standards. VHDL and Verilog are general purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is first written and then compiled by an HDL compiler. The HDL source code describes at some level the circuit elements, and the compiler produces an RTL netlist from this compilation. The RTL netlist can be a technology independent netlist in that it is independent of the technology or architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist which can be used to create circuits in the vendor's technology or architecture. It is well known that FPGA vendors utilize different technology or architecture to implement logic circuits within their integrated circuits. Thus, the technology independent RTL netlist is mapped to create a netlist which is specific to a particular vendor's technology or architecture.

A floor planning operation can then be applied to plan the layout of a particular integrated circuit and to control timing problems and to manage interconnections between regions of an integrated circuit. A typical floor planning operation divides the circuit area of an integrated circuit into regions, sometimes called "blocks," and then assigns logic to reside in a block. After placement of components on the chip and routing of wires between components, timing analysis (e.g., timing simulation or static timing analysis) can be performed to accurately determine the signal delays between logic elements. Back annotation is typically performed to update a more-abstract design with information from later design stages.

A problem with very large scale integrated circuits is the propagation delay to different device locations, especially from the core to the peripheral of the integrated circuit. The following descriptions describe specifically the reset signal propagation delay, but the invention is not so restricted, and can be applied to reduce the propagation delay of other signals. The conventional prior art circuits typically treat reset signal as a global signal, meaning a reset source provides a reset signal to drive all the reset pins of the sequential elements. This approach can leave the sequential elements with an unpredictable state, especially after the termination of the reset signal for sequential elements located far away from the reset signal source. For example, consider two sequential elements with different propagation delays from the reset signal source. After the assertion of the reset signal, these sequential elements both get reset. Then the reset signal de-asserts just before the clock edge. The sequential element with a short propagation delay comes out of the reset state following the clock edge. The other element with a long propagation delay, however, may miss the clock edge, so it remains in reset state, damaging the circuit performance. This problem is more pronounced when sequential elements are distributed in remote areas of the circuit, such as in the peripheral areas for I/O (Input/Output) modules.

SUMMARY OF THE DESCRIPTION

Embodiments of the present invention disclose methods and apparatuses to reduce metastability problems related to reset signals in integrated circuits, with preferred applications in automatic physical synthesis for RTL (register transfer level) netlist. The metastability problem is typically caused by the delay in the reset signal propagation to widely different distances to reach devices placed far apart from each other.

In an embodiment, the present invention discloses a reset conditioning circuit to reduce the metastability problem due to reset signal propagation delay. The reset conditioning circuit provides a synchronous and an asynchronous reset signal outputs with the asynchronous reset signal extended a predetermined number of clock cycles longer, together with making the reset signal's de-assertion synchronized with a rising clock edge. The asynchronous reset signal extends to a certain propagation extension time to cover all devices at the same time irrespective of interconnect distances, thus provides a reliable reset signal to all circuit sequential elements to avoid unpredictable states, especially after the reset is de-asserted, and to ensure that the circuit registers reliably come out of the reset state at the same clock cycle. In one aspect of the invention, the circuit sequential elements are located in the peripheral of the integrated circuit.

In another embodiment, the reset conditioning circuit replicates a synchronous reset signal through physical devices to provide a reset signal close to loads or registers at a plurality of circuit modules or partitions to eliminate all possible delay propagation problems, and to guarantee that all loads and registers throughout the circuit area reset or come out of reset state reliably. The replication of reset conditioning circuitry also serves to ensure the presence of local signal to eliminate the long delay.

The present invention is preferably employed in automatic physical synthesis for RTL netlist conversion. According to another aspect of the present invention, an exemplary method discloses a reset conditioning circuit for reset signal conditioning in automatic RTL physical synthesis. A reset conditioning circuit is automatically synthesized to provide an extended asynchronous reset signal, and to provide a synchronous reset signal closer to the circuit. The reset conditioning circuit for the reset signal conditioning can be split into a plurality of RTL components, with a portion of the conditioning circuit plus a plurality of reset register duplicated in other modules, partitions or chips. The replication process is selected for a plurality of modules or partitions based on the propagation distance of the reset signal with respect to the reset registers to eliminate any delay timing issues.

In a typical example of this method, a reset signal delay estimation may be performed to specify the delay timing for the reset conditioning circuit. The delay timing is preferably 3 to 4 clock cycles.

The present invention also discloses apparatuses, including software media which may be used to design integrated circuits. For example, the present invention includes digital processing systems which are capable of designing integrated circuits according to the present invention, and the invention also provides machine readable media which stores computer program instructions, and which, when executed on a digital processing system, such as a computer system, causes the digital processing system to execute a method for designing integrated circuits.

Other features of the present invention will be apparent from the accompanying drawings and from the detailed description which follow.

BRIEF DESCRIPTION OF THE DRAWINGS

The present invention is illustrated by way of example and not limitation in the figures of the accompanying drawings in which like references indicate similar elements.

DETAILED DESCRIPTION OF THE INVENTION

Figure 1:
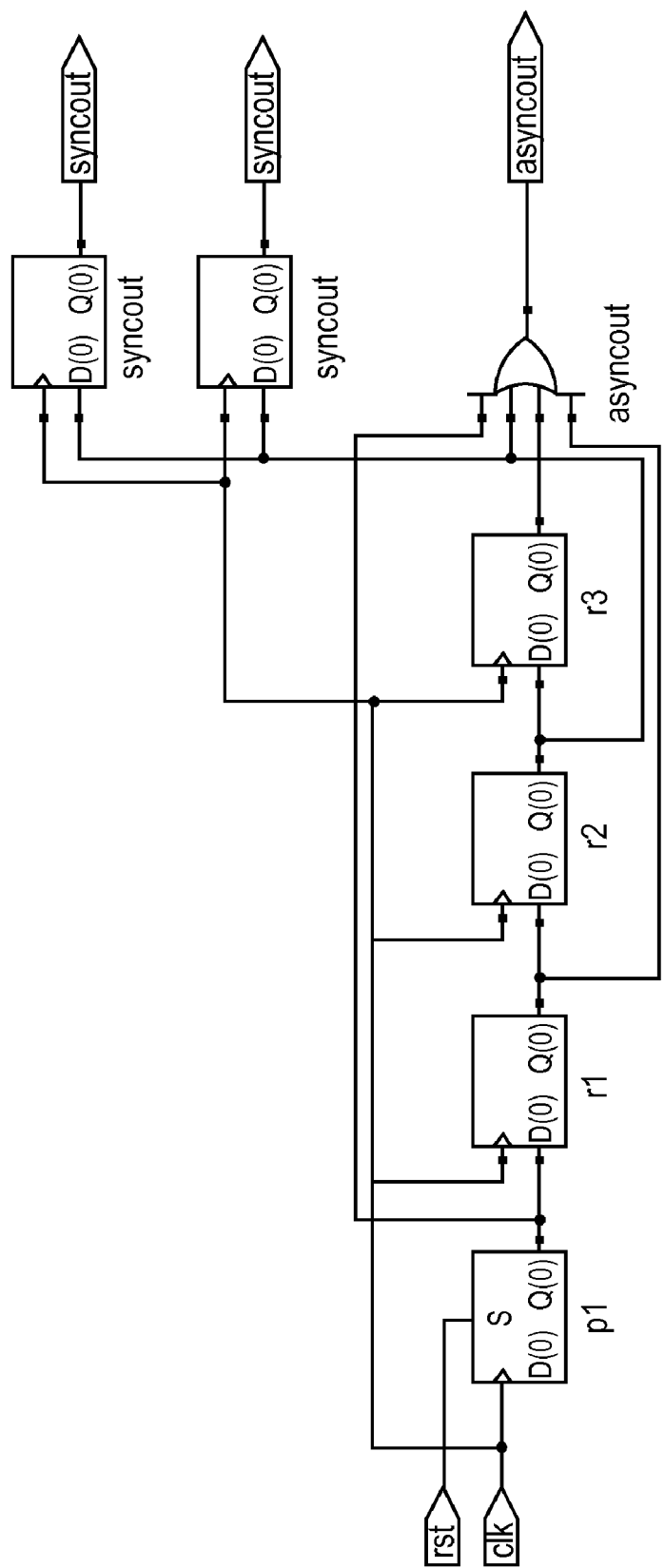
FIG. 1 shows the schematic of the reset conditioning circuit according to an embodiment of the present invention.

The present invention discloses, among other things, a reset conditioning methodology, a reset conditioning circuit and its application to physical synthesis of RTL netlists to reduce metastability problems due to the propagation delay of reset signals. The reset signal propagation delay is typically caused by the widely different propagation distances between the device emitting and the devices receiving the reset signal. In an embodiment, a reset conditioning circuit is inserted into the original integrated circuit to make the reset behavior more reliable to avoid unpredictable states, especially for the de-assertion state of the reset signal. The reset conditioning circuit can provide a synchronous reset signal output and an asynchronous reset signal output. The asynchronous reset signal output can be extended into several clock cycles longer than the original reset signal so that all the load registers employing asynchronous reset signal will get the reset properly. Further, the reset conditioning circuit can modify the timing of the reset signal so that its de-assertion edge is synchronized with a rising clock edge. In another embodiment, the reset circuit replicates a synchronous reset signal to provide a reset signal closer to loads or registers at a plurality of circuit modules or partitions. The generation of the reset conditioning circuit is well suitable for physical synthesis of RTL netlists, especially for automatic physical synthesis.

These and other embodiments of the present invention may be realized in accordance with the following teachings and it should be evident that various modifications and changes may be made without departing from the broader spirit and scope of the invention. The following description and drawings are illustrative of the invention and are not to be construed as limiting the invention. Numerous specific details are described to provide a thorough understanding of the present invention, and should be regarded in an illustrative rather than restrictive sense and the invention measured only in terms of the claims. Also, in certain instances, well known or conventional details are not described in order to avoid obscuring the description of the present invention.

One embodiment of the present invention to reduce the metastability problem is to provide conditioning reset signals to ensure proper reset timing irrespective of delay in signal propagation. The exemplary embodiment comprises the insertion of a reset conditioning circuit to provide an asynchronous reset signal output. The asynchronous reset signal output is preferably extended by a propagation extension period, which comprises a predetermined number of clock cycles, and also being modified to ensure that the signal's de-assertion edge is in synchronization with a rising clock edge. The propagation extension can be determined based on a propagation delay estimate, and preferably comprises a predetermined number of clock cycles, for example, 1 to 10 clock cycles, and more preferably 3 or 4 clock cycles. The reset conditional circuit typically receives input from the clock signal and the original reset signal, and provides an extended asynchronous reset signal. The output of the reset conditioning circuit is preferably provided to the peripheral sequential elements such as I/O modules, which communicate with the environment outside the original circuit, thus requiring the capability of asynchronous reset.

The assertion and de-assertion of the reset signal can create timing violation if not synchronized with the clock edge, most likely with the rising clock edge. An embodiment of the present invention also provides the necessary modification to ensure the reset signal output from the reset conditioning circuit has the proper synchronization with the clock edge. For example, the assertion or the de-assertion edge of the modified reset signal is in synchronization with the rising clock edge.

Another embodiment of the present invention to reduce the metastability problem is to duplicate a portion of the reset conditioning circuit, typically a reset register, at various modules in the signal paths to compensate for the unequal delays. This technique provides a synchronous reset signal close to the logic elements, thus eliminate any problems related to reset signal propagation delay. With the duplication of the reset register, the synchronous reset signal output can be one or more clock cycles behind the original reset signal. The lagging of the reset signal output can be compensated by software, taking into account the longer delay of the synchronous reset signal.

Still another embodiment of the present invention is a reset conditioning circuit providing both an asynchronous reset signal output and a synchronous reset signal output. The asynchronous reset signal is extended from the original reset signal a predetermined number of clock cycles, and with the de-assertion edge synchronized with a clock rising edge. The synchronous reset signal can be duplicated to a plurality of modules load register, and with the assertion and de-assertion edges synchronized with a clock rising edge.

According to one aspect of the present invention, the reset conditioning circuit can be applied to each clock domain separately with one reset conditioning circuit serving one clock domain. Since different clock domains are likely to have different clock speeds, different reset conditioning circuits with different propagation extensions can be applied to provide an integrated circuit with no timing violations.

Another embodiment of the present invention provides an automatic synthesis of reset signal, incorporating the reset conditioning circuit and the duplication of the reset registers to various modules or partitions. In a typical example of this method, a reset conditioning circuit is inserted into the integrated circuit, and then a replication operation may be performed to replicate the reset register to certain modules, partitions or chips. The reset conditioning circuit thus comprises an extension of the asynchronous reset signal, a modification to synchronize the de-assertion edge of the reset signal to a rising edge of the clock signal, and a duplication of reset registers closer to the load registers.

In one aspect of the invention, the method includes the estimation of the propagation delay for the reset signal, identification of peripheral or I/O modules or core modules affected by the propagation delay, and then automatically providing a reset conditioning circuit for the HDL code, the technology-independent RTL netlist, or the RTL netlist mapped on a target architecture.

The reset conditioning circuit according to an embodiment of the invention ensures the registers in the original circuit reliably come out of the reset state at the same clock cycle. The reset circuit is preferably inserted into the original circuit, and comprises inputs from the original clock and reset signal, and two reset conditioning outputs. One output drives the reset pin of the sequential elements in the core of the original integrated circuit. This output is preferably a synchronous reset output, which is also provided to a duplicated reset register to ensure circuit proximity. This output is also preferably having the signal's assertion and de-assertion edges synchronized with a rising clock edge. The other output drives the reset pin of the sequential elements in the peripheral of the original circuit. This output is preferably asynchronous reset output, which is preferably extended a number of clock cycles, preferably 3-4 clock cycles longer. This output is also preferably having the signal's de-assertion edge synchronized with a rising clock edge.

FIG. 1 shows an exemplary schematic circuit for the reset conditioning circuit. The circuit comprises a series of delay flip-flops such as D flip-flops. The circuit as shown comprises a series of 4 D flip-flops (p1, r1, r2 and r3) to provide a propagation extension of 4 clock cycles to the asynchronous reset signal. A different number of delay flip-flops will provide a different propagation extension. All flip-flops receive a common clock signal from the clock circuitry. The flip-flops are connected in series, with the output of the previous flip-flop connected to the input of the next flip-flop. The first flip-flop p1 receives the original reset signal to the reset input. All outputs from the 4 flip-flops are provided to a multiple-input OR gate asyncout with the output of this OR gate being the resulting asynchronous reset signal. The output from the last flip-flop r3 is also the synchronous reset signal for the reset conditioning circuit. A portion of the reset conditioning circuit, e.g. the reset register r3, can be plurality replicated, e.g. the duplicated registers syncout, to bring the synchronous reset signal closer to the necessary modules such as load registers. The duplicated reset register syncout receives input from the next to last flip-flop r2, and behaves like the last flip-flop r3 to ensure identical synchronous reset signal.

The reset conditioning circuit therefore comprises two outputs, a synchronous reset signal syncout and an asynchronous reset signal asyncout. The output syncout is driven by a register r3, and also by the duplicatable reset registers syncout. This register can be replicated through the physical device to distribute the reset signal close to its loads. The reset conditioning circuit also comprises an input reset signal rst, provided to the first register p1. After the reset signal rst is asserted, the output of register p1 is high immediately after a short propagation delay. After 3 clock edges (between 2 to 3 clock cycles), register r3 and syncout will be asserted, providing a reliable reset signal to registers in the original integrated circuit. When the reset is de-asserted, the output of r3 and syncout will be de-asserted after 4 clock edges (between 3 to 4 clock cycles). Because syncout can be replicated and the copies of the register are close to the loads, it ensures the load registers in the original circuit to come out of reset state at the same clock cycle.

The output asyncout is driven by the OR gate. One purpose of this output is to provide a reset signal to the registers on the peripheral of the circuit. Those registers communicate with environment outside the original circuit, thus requiring the capability of getting reset asynchronously. When reset signal is asserted, the asyncout output is reset immediately after a short propagation delay. This is because the output of register p1 drives the OR gate. The de-assertion of reset is similar to the syncout signal, therefore 4 clock edges after the reset is de-asserted, asyncout is de-asserted.

Figure 2:
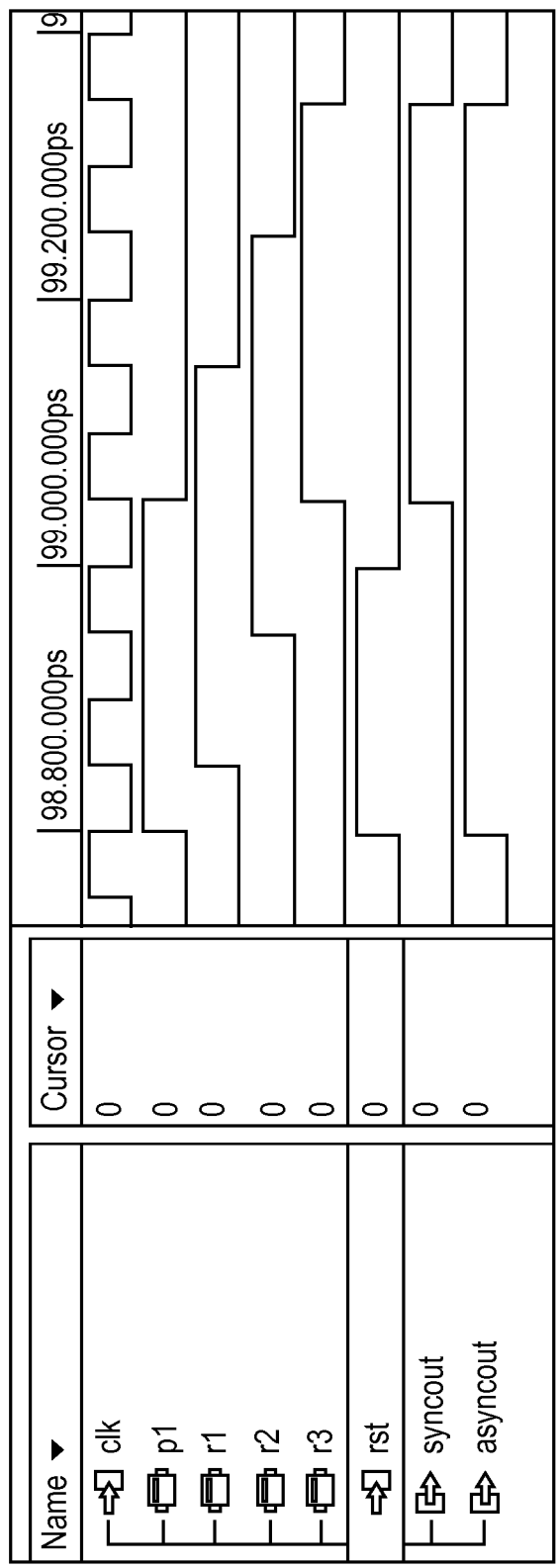
FIG. 2 shows the signal timings for the reset conditioning circuit.

FIG. 2 shows the simulation waveforms for the signals in the reset conditioning circuit described above. The original reset signal rst as shown has a rising edge synchronized with a clock falling edge. Since the reset signal rst is applied to the reset input, the start of p1 is immediately followed the assertion of rst signal. After the rst signal de-asserts, p1 is de-asserted at the next rising edge of the clock cycle. The output of r1 starts within one cycle from the assertion of rst (or p1) signal, and de-asserts after one cycle from p1 signal. The signal outputs of r3 and r3 are similar to that of r2 signal with one and two clock cycles later. The output of r3 is the output synchronous reset signal of the reset conditioning circuit. It essentially synchronizes the edge of the original reset signal rst to a rising edge of the clock, thus the synchronous reset output signal has the rising edge shifted toward the previous rising edge of the clock, and the falling edge shifted toward the next rising edge of the clock. The output signal syncout of the syncout register is the same as the output of the r3 register.

The asynchronous output asyncout is the combination of the output signals of p1, r1, r2 and r3, and thus has the rising edge as the p1 signal (same as the original rst signal), and the falling edge of the r3 signal. The asyncout signal has the falling edge synchronized with the rising clock edge, same as that of r3 signal. The rising edge of the asynchronous output signal does not change.

The reset conditioning circuit of FIG. 1 provides both an asynchronous reset signal output and a synchronous reset signal output. In an embodiment, the asynchronous reset signal can be eliminated by removing the OR gate. The delay of the synchronous reset signal can be shortened by further removing the delay register p1, r1, r2, or any combination of these registers. In an embodiment, the reset conditioning circuit comprises only the reset register r3, plus any needed duplicated register syncout.

In an embodiment, the present invention well suited for automatic physical synthesis by automatically building reset conditioning circuit and allowing replication of reset register to drive the synchronous reset signal. At least one embodiment of the present invention seeks to compensate for wire delays in physical synthesis. Based on wire delay estimations, improvements can be performed to remove possible timing violations to improve logic synthesis accuracy. Examples of optimizations of some embodiments of the present invention involve inserting reset conditioning circuit with the replication of reset registers to reduce the delay on the logic elements that follow the replicated reset registers.

The advantage of the formulations according to the present invention is that timing violation between the global reset source and the sequential element destination areas is automatically taken into account. Thus, the reset behaviors are much more reliable. When methods of various embodiments of present invention are used to improve the timing accuracy of reset propagation delays, optimizations for the designs of integrated circuits (e.g., ASIC or FPGA) using such improved reset conditioning circuit can be more effective with less iterations.

Figure 3:
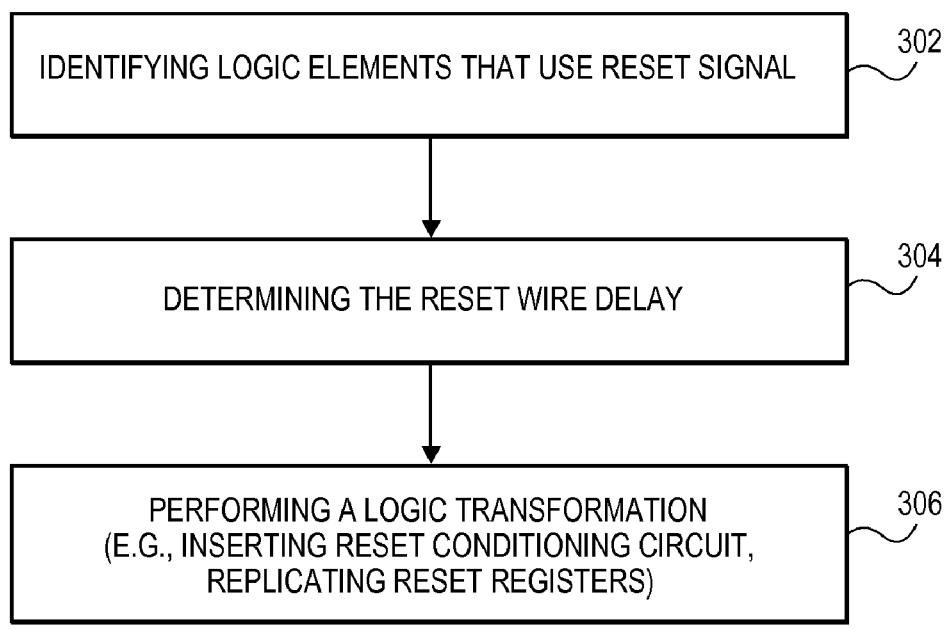
FIG. 3 shows a flow chart of a method to design a reset conditioning circuit according to one embodiment of the present invention.

FIG. 3 shows a flow chart of a method to optimize a logic circuit for timing requirements according to one embodiment of the present invention. After operation 302 identifies logic elements using reset signal, either an asynchronous reset signal or a synchronous reset signal, and after operation 304 determines the reset wire delay from the global reset source to the logic elements, operation 306 performs a logic transformation for the reset signal (e.g., replicating logic elements).

The logic transformation of operation 306 can comprise the insertion of a reset conditioning circuit to provide an asynchronous reset signal output, to extend the asynchronous reset signal for a propagation extension period, or to modify the reset timing to provide the reset signal's de-assertion edge to synchronize with the clock rising edge. The logic transformation of operation 306 can also comprise the duplication of reset registers for logic elements requiring closer reset signal propagation. Operation 304 can estimate the propagation extension from the wire delay from the reset source to the sequential elements at the core or at the peripheral of the circuit. In a preferred embodiment, the operation 304 can be skipped and a predetermined value for the propagation extension is used, which is preferably 2-6 clock cycles with a most preferred value of 3-4 clock cycles. In another preferred embodiment, the operation 302 can be skipped and the reset conditioning circuit is automatically inserted to all modules, registers or and loads requiring a reset signal.

Figure 4A:
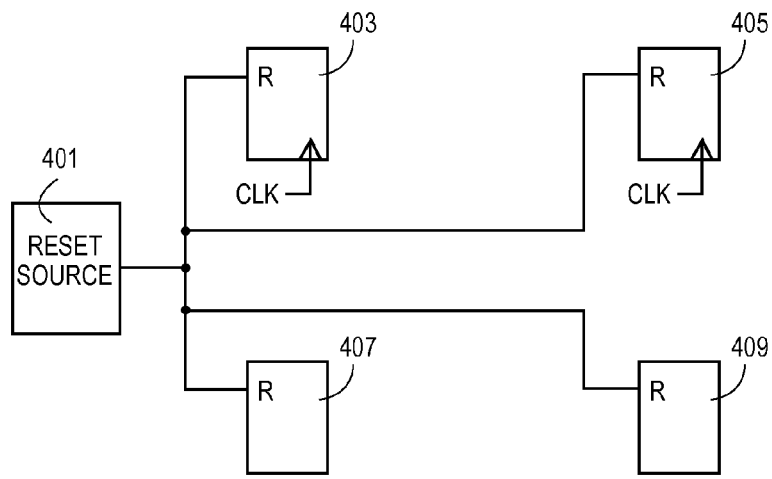
FIG. 4A shows an example of a design of integrated circuit before the implementation of a reset conditioning circuit according to one embodiment of the present invention.
Figure 4B:
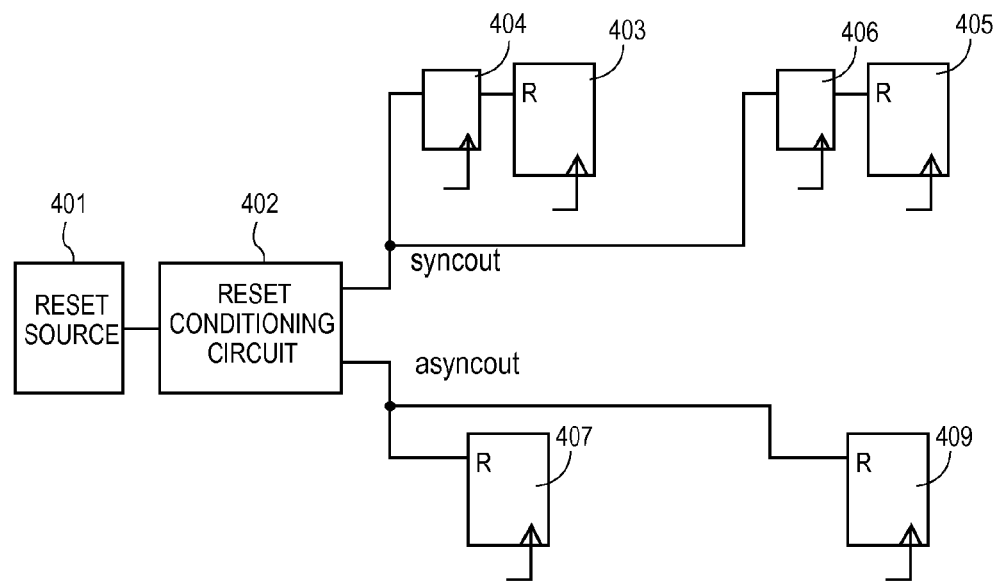
FIG. 4B shows an example of a design of integrated circuit after the implementation of a reset conditioning circuit according to one embodiment of the present invention.

FIGS. 4A and 4B show a method to implement reset conditioning circuit for meeting timing requirements according to one embodiment of the present invention. In FIG. 4A, a reset source 401 generates a reset signal and distributes to a plurality of sequential elements 403, 405, 407 and 409. Sequential elements 403 and 405 are synchronous logic elements, typically located in the core of the integrated circuit and sequential elements 407 and 409 are asynchronous logic elements, typically located in the peripheral (e.g. I/O modules) of the integrated circuit. Sequential elements 403 and 407 are located near the reset source, and sequential elements 405 and 409 are located far from the reset source. The distribution of the synchronous and asynchronous logic elements at the core and at the peripheral might generate timing violations, resulting in less than optimal circuit performance. In FIG. 4B, a reset conditioning circuit 402 is inserted after the reset source 401. The reset conditioning circuit 402 splits the reset signal into a synchronous reset signal to drive the synchronous logic elements 403 and 405, and an asynchronous reset signal to drive the asynchronous logic elements 407 and 409. The asynchronous reset signal can have the timing and duration modified (e.g. longer duration, synchronized edge) to compensate for wire delays due to logic elements' locations. The implementation can duplicate a fanout for reset registers 404/406 to drive sequential logic elements 403/405. With the reset registers 404/406 placed closer to the logic elements 403/405, timing violations due to wire delay can be avoided.

While most embodiments of the present invention are intended for use in an HDL design synthesis software program, the invention is not necessarily limited to such use. Although use of other languages and computer programs is possible (e.g. a computer program may be written to describe hardware and thus be considered an expression in an HDL and may be compiled or the invention, in some embodiments, may allocate and reallocate a logic representation, e.g. a netlist, which was created without the use of an HDL), embodiments of the present invention will be described in the context of use in HDL synthesis systems, and particularly those designed for use with integrated circuits which have vendor-specific technology/architectures. As is well known, the target architecture is typically determined by a supplier of programmable ICs. An example of a target architecture is the programmable lookup tables (LUTS) and associated logic of the integrated circuits which are field programmable gate arrays from Xilinx, Inc. of San Jose, Calif. Other examples of target architecture/technology include those well known architectures in field programmable gate arrays and complex programmable logic devices from vendors such as Altera, Lucent Technology, Advanced Micro Devices, and Lattice Semiconductor. For certain embodiments, the present invention may also be employed with application-specific integrated circuits (ASICs).

Figure 5:
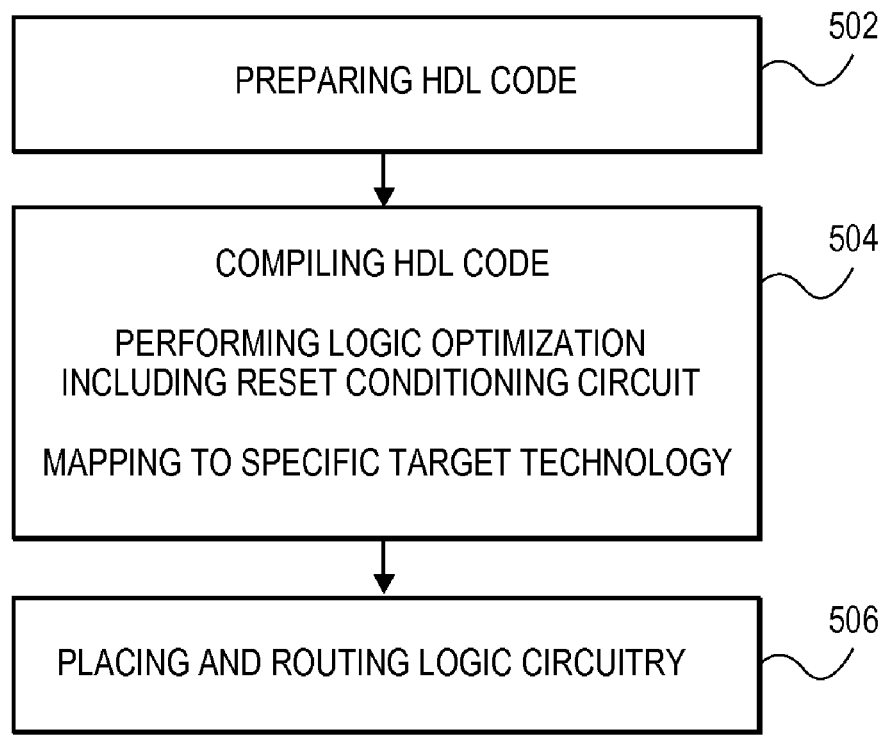
FIG. 5 shows a flow chart of a method to design an integrated circuit according to one embodiment of the present invention.

FIG. 5 shows a HDL design synthesis methodology which can employs the present invention reset conditioning circuit. In operation 502, HDL code for the integrated circuit is prepared. In operation 504, the HDL prepared in operation 502 is compiled to produce a netlist which is typically optimized by performing logic optimization. The logic optimization can include the reset conditioning circuit described above. Thereafter, a mapping process maps the netlist to a specific target technology which is determined by the targeted architecture of the integrated circuit (e.g. ASIC, FPGA). It is well-known that the various vendors of FPGA ICs such as Xilinx and Altera, use different arrangements of transistors to create logic circuits. Accordingly, a technology independent netlist that is often created by the compilation of HDL code must be mapped to the specific technology in the vendor's IC which will be used to implement the logic. At the end of operation 504, the synthesis has been completed and a netlist which is specific to the technology/architecture used in the vendor's IC is now provided. This netlist is effectively at a gate level and can be partitioned between several ICs if needed. After operation 504, a conventional place and route operation is performed on the logic circuit in operation 506 in order to create a design of the circuitry in each of the ICs.

Figure 6:
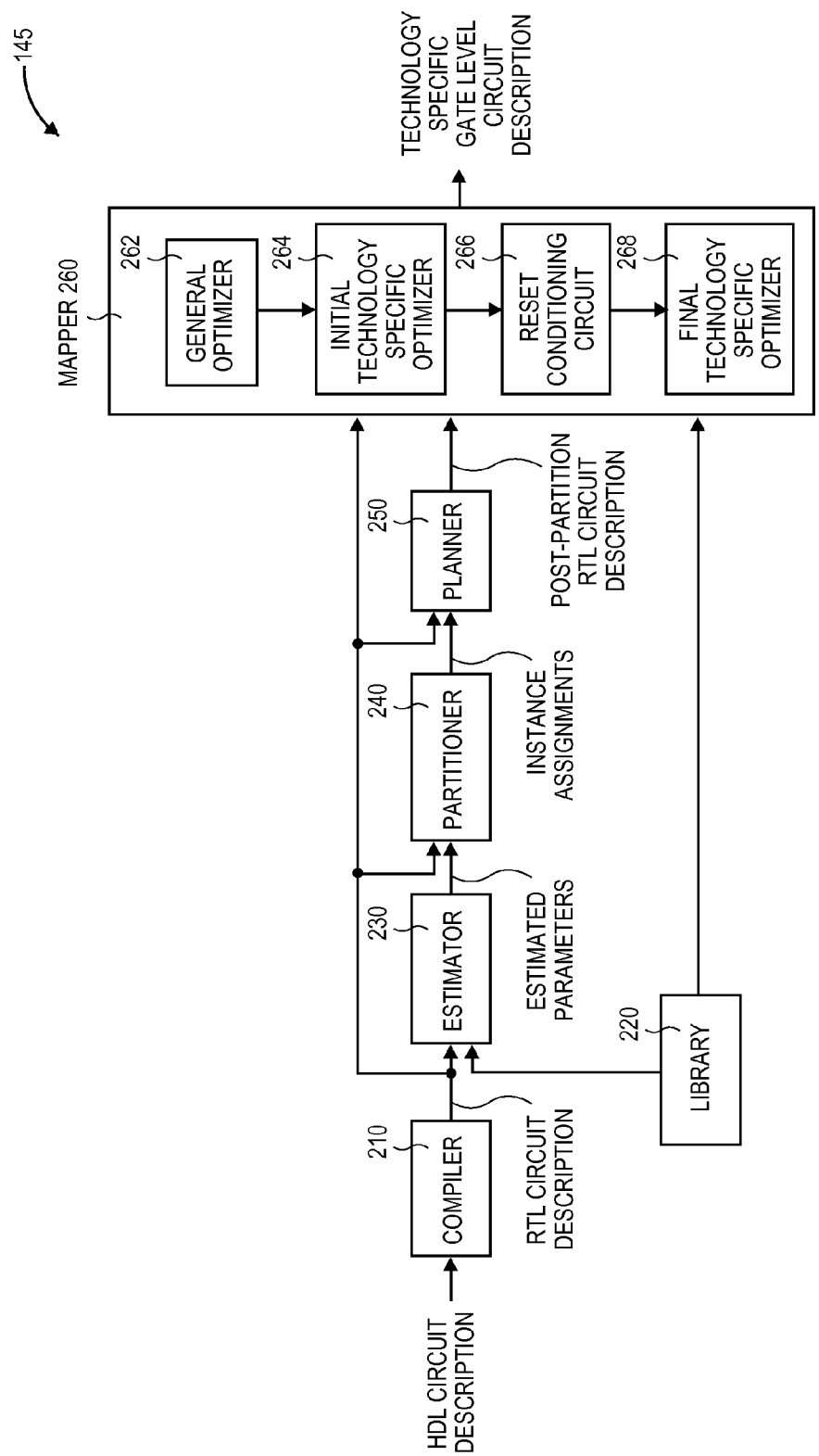
FIG. 6 shows an example of a method to design an integrated circuit according to one embodiment of the present invention.

One embodiment of the present invention may be a circuit design and synthesis computer aided design software that is implemented as a computer program which is stored in a machine readable media, such as a CD ROM or a magnetic hard disk or an optical disk or various other alternative storage devices. FIG. 6 is a diagram illustrating a design synthesis tool 145 according to one embodiment of the invention. The design synthesis tool 145 includes a compiler 210, a library 220, an estimator 230, a partitioner 240, a planner 250, and a mapper 260. Note that this is only for illustrative purposes. The design synthesis tool 100 may have more or less components than listed above. For example, the design synthesis tool 100 may include the compiler 210, the library 220, and the mapper 260. The design synthesis tool 145 may be a software package in a computer aided design (CAD) environment. The design synthesis tool 145 is used by design engineers for designing, synthesizing, and simulating a circuit or a project. The design synthesis tool 145 may be used as part of a design process for Applications Specific Integrated Circuit (ASIC) devices, programmable device such as programmable logic devices (PLD), complex PLD (CPLD), field programmable logic array (FPGA), etc.

The compiler 210 compiles a source program containing a hardware description language (HDL) circuit description. The HDL may be any appropriate HDL such as Very High Speed Integrated Circuit Hardware Description Language (VHDL) or Verilog. The compiler 210 generates a register transfer level (RTL) circuit description from the HDL circuit description. The library 220 contains previously compiled circuit descriptions, vendors' circuit descriptions, functions, packages, or any other useful components that can be linked, combined, and integrated with the current RTL circuit description. The estimator 230 estimates functional and/or physical parameters related to the circuit or project. Some examples of the parameters include the circuit complexity (e.g., number of gates), circuit size, power consumption, overall timings, etc. The estimator 230 receives the RTL circuit description from the compiler 210 and other information from the library 220 to generate the estimated parameters.

The partitioner 250 generates instance assignments based on the RTL circuit description and the estimated parameters. The planner 250 generates post-partition RTL circuit description from the RTL circuit description and the instance assignments.

The mapper 260 generates technology-specific gate level circuit description from the post-partition RTL circuit description and other useful information from the library 220. The mapper 260 may also generates the technology-specific gate level circuit description directly from the RTL circuit description and the library information. The mapper 260 includes a general optimizer 262, an initial technology specific optimizer 264, a reset conditioning circuit 266, and a final technology specific optimizer 268. The general optimizer 262 optimizes the gate level circuit description without considering the specific technology or device that the circuit will eventually be implemented. The initial technology specific optimizer 264 performs the initial optimization based on the general optimization. The reset conditioning circuit 266 further optimizes the circuit description by reducing metastability, extending asynchronous reset signal, synchronizing reset signal with rising clock edge, and replicating reset registers closer to load registers. The final technology specific optimizer 268 generates the final optimized gate level circuit description specifically for the technology to be used such as the specific selected device. The final optimized gate level circuit description may then be simulated and downloaded into the specific device for physical implementation. The reset conditioning circuit 266 is typically a program code, a function, a subprogram, a procedure, or a routine which, when executed, causes the processor 110 to perform the tasks as explained above.

The foregoing methods shown in FIGS. 3-6 will be understood to be one general example of a method of the present invention. The insertion of the reset conditioning circuit can be embedded in the HDL code of operation 502, instead of in the logic optimization of operation 504. The propagation extension of the asynchronous reset signal can be predetermined (e.g. 3-4 clock cycles), or can be determined from the estimation of the wire delay from the reset source to the peripheral elements. The reset conditioning circuit can comprise only a synchronous reset signal output, an asynchronous reset signal output, or both reset signal outputs. The reset conditioning circuit 266 can be located before or after the initial optimizer 264, or even before or after the compiler operation 210.

Further, many of the methods of the present invention may be performed with a digital processing system, such as a conventional, general purpose computer system. Special purpose computers which are designed or programmed to perform only one function may also be used.

Figure 7:
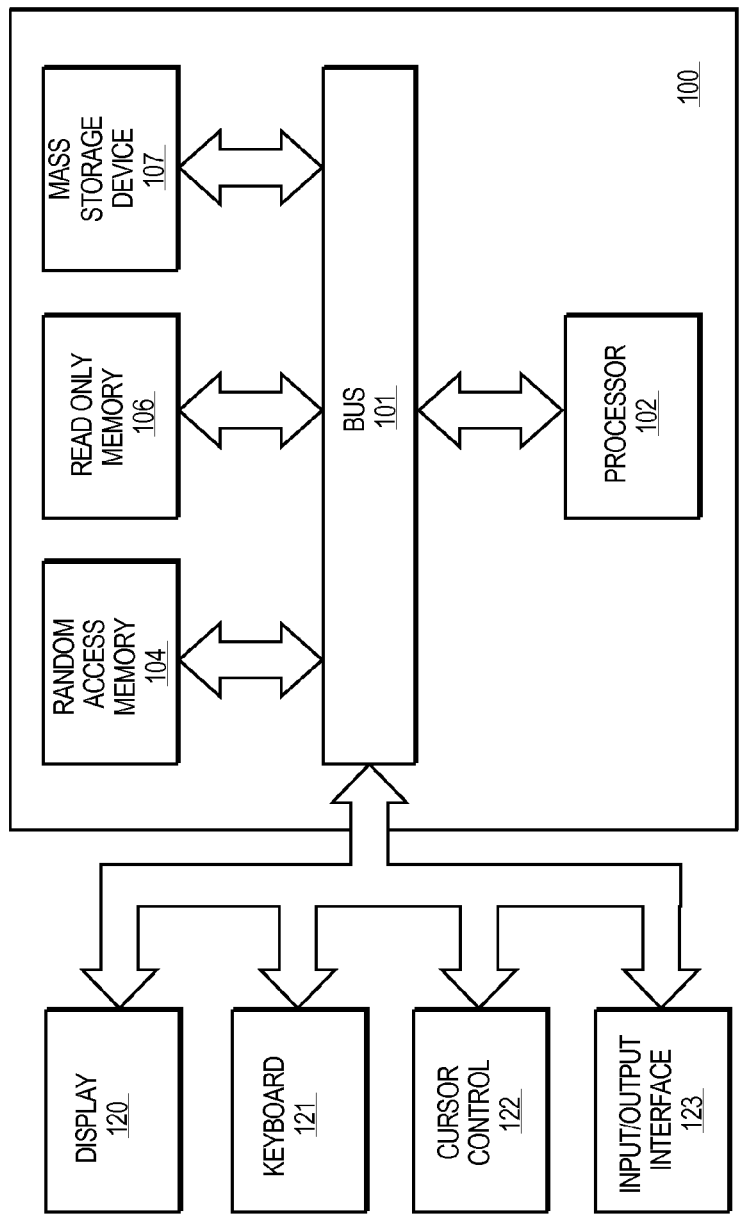
FIG. 7 shows a block diagram example of a data processing system which may be used with the present invention.

FIG. 7 shows one example of a typical computer system which may be used with the present invention. The computer system is used to perform logic synthesis of a design that is described in an HDL code. Note that while FIG. 7 illustrates various components of a computer system, it is not intended to represent any particular architecture or manner of interconnecting the components as such details are not germane to the present invention. It should be noted that the architecture of FIG. 7 is provided for purposes of illustration only and that a computer system or other digital processing system used in conjunction with the present invention is not limited to this specific architecture. It will also be appreciated that network computers and other data processing systems which have fewer components or perhaps more components may also be used with the present invention. The computer system of FIG. 7 may, for example, be an Apple Macintosh computer.

As shown in FIG. 7, the computer system 101, which is a form of a data processing system, includes a bus 102 which is coupled to a microprocessor 103 and a ROM 107 and volatile RAM 105 and a non-volatile memory 106. The microprocessor 103, which may be a G3 or G4 microprocessor from Motorola, Inc. or IBM, is coupled to cache memory 104. The bus 102 interconnects these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 110 are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 7 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software, nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable medium can be used to store software and data which when executed by a data processing system causes the system to perform various methods of the present invention. This executable software and data may be stored in various places including for example ROM 107, volatile RAM 105, non-volatile memory 106 and/or cache 104. Portions of this software and/or data may be stored in any one of these storage devices.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method to design a logic circuit, the method comprising:
    inserting into the logic circuit, a reset conditioning circuit to shift an edge in time of a reset signal to synchronize with an edge of a clock to improve circuit reliability related to reset signal propagation delay, the inserting being performed on a representation of the logic circuit, the representation being stored in a memory of a data processing system which includes a processor which performs the inserting,
    wherein the reset conditioning circuit receives the reset signal as an input signal, and provides a synchronous reset signal and an asynchronous reset signal as reset signal outputs,
    wherein the asynchronous reset signal output is longer than the reset signal by a predetermined number of clock cycles,
    wherein the predetermined number of clock cycles is between 3 and 4 clock cycles.

2. A method to design a logic circuit, the method comprising:
    inserting into the logic circuit, a reset conditioning circuit to shift an edge in time of a reset signal to synchronize with an edge of a clock to improve circuit reliability related to reset signal propagation delay, the inserting being performed on a representation of the logic circuit, the representation being stored in a memory of a data processing system which includes a processor which performs the inserting,
    wherein the reset conditioning circuit receives the reset signal as an input signal, and provides a synchronous reset signal and an asynchronous reset signal as reset signal outputs,
    wherein the asynchronous reset signal output has the assertion edge identical to the assertion edge of the reset signal.

3. A method as in claim 2 further comprising replicating a portion of the reset conditioning circuit.

4. A method as in claim 2 further comprising adding a plurality of reset conditioning circuits, wherein each reset conditioning circuit corresponds to a clock domain.

5. A method as in claim 2 wherein the reset signal outputs have the de-assertion edge synchronized with a rising clock edge.

6. A method as in claim 2 wherein the synchronous reset signal output has the assertion edge synchronized with a rising clock edge.

7. A method as in claim 2 wherein the inserting is performed automatically.

8. A method to design a logic circuit, the method comprising:
    inserting into the logic circuit, a reset conditioning circuit to shift an edge in time of a reset signal to synchronize with an edge of a clock to improve circuit reliability related to reset signal propagation delay, the inserting being performed on a representation of the logic circuit, the representation being stored in a memory of a data processing system which includes a processor which performs the inserting,
    wherein the reset conditioning circuit receiving the reset signal as an input signal, and providing a synchronous reset signal and an asynchronous reset signal as reset signal outputs,
    wherein the asynchronous reset signal output is longer than the reset signal by a predetermined number of clock cycles,
    wherein the reset signal outputs have the de-assertion edge synchronized with a rising clock edge; and
    replicating a portion of the reset conditioning circuit to duplicate the synchronous reset signal.

9. A method as in claim 8 further comprising adding a plurality of reset conditioning circuits, wherein each reset conditioning circuit corresponds to a clock domain.

10. A method as in claim 8 wherein the synchronous reset signal output has the assertion edge synchronized with a rising clock edge.

11. A machine readable medium containing executable computer program instructions which when executed by a digital processing system cause said system to perform a method to design a logic circuit, the method comprising:
    inserting into the logic circuit, a reset conditioning circuit to shift an edge in time of a reset signal to synchronize with an edge of a clock to improve circuit reliability related to reset signal propagation delay, the inserting being performed on a representation of the logic circuit, the representation being stored in a memory of the digital processing system which includes a processor which performs the inserting,
    wherein the reset conditioning circuit receiving the reset signal as an input signal, and providing a synchronous reset signal and an asynchronous reset signal as reset signal outputs, wherein the asynchronous reset signal output is longer than the reset signal by a predetermined number of clock cycles, wherein the predetermined number of clock cycles is between 3 and 4 clock cycles.

12. A machine readable medium containing executable computer program instructions which when executed by a digital processing system cause said system to perform a method to design a logic circuit, the method comprising:

inserting into the logic circuit, a reset conditioning circuit to shift an edge in time of a reset signal to synchronize with an edge of a clock to improve circuit reliability related to reset signal propagation delay, the inserting being performed on a representation of the logic circuit, the representation being stored in a memory of the digital processing system which includes a processor which performs the inserting, wherein the reset conditioning circuit receiving the reset signal as an input signal, and providing a synchronous reset signal and an asynchronous reset signal as reset signal outputs, wherein the asynchronous reset signal output has the assertion edge identical to the assertion edge of the reset signal.

13. A medium as in claim 12 further comprising replicating a portion of the reset conditioning circuit.

14. A medium as in claim 12 further comprising adding a plurality of reset conditioning circuits, wherein each reset conditioning circuit corresponds to a clock domain.

15. A medium as in claim 12 wherein the reset signal outputs have the de-assertion edge synchronized with a rising clock edge.

16. A medium as in claim 12 wherein the synchronous reset signal output has the assertion edge synchronized with a rising clock edge.

17. A medium as in claim 12 wherein the inserting is performed automatically.

18. A machine readable medium containing executable computer program instructions which when executed by a digital processing system cause said system to perform a method to design a logic circuit, the method comprising:

inserting into the logic circuit, a reset conditioning circuit to shift an edge in time of a reset signal to synchronize with an edge of a clock to improve circuit reliability related to reset signal propagation delay, the inserting being performed on a representation of the logic circuit, the representation being stored in a memory of the digital processing system which includes a processor which performs the inserting, wherein the reset conditioning circuit receiving the reset signal as an input signal, and providing a synchronous reset signal and an asynchronous reset signal as reset signal outputs, wherein the asynchronous reset signal output is longer than the reset signal by a predetermined number of clock cycles, wherein the reset signal outputs have the de-assertion edge synchronized with a rising clock edge, and replicating a portion of the reset conditioning circuit to duplicate the synchronous reset signal.

19. A medium as in claim 18 further comprising adding a plurality of reset conditioning circuits, wherein each reset conditioning circuit corresponds to a clock domain.

20. A medium as in claim 18 wherein the synchronous reset signal output has the assertion edge synchronized with a rising clock edge.

21. A digital processing system to design a logic circuit, the digital processing system comprising means for inserting into the logic circuit, a reset conditioning circuit to shift an edge in time of a reset signal to synchronize with an edge of a clock to improve circuit reliability related to reset signal propagation delay, the inserting being performed on a representation of the logic circuit, the representation being stored in a memory of the digital processing system which includes a processor which performs the inserting, wherein the reset conditioning circuit receiving the reset signal as an input signal, and providing a synchronous reset signal and an asynchronous reset signal as reset signal outputs, wherein the asynchronous reset signal output is longer than the reset signal by a predetermined number of clock cycles, wherein the predetermined number of clock cycles is between 3 and 4 clock cycles.

22. A digital processing system to design a logic circuit, the digital processing system comprising means for inserting into the logic circuit, a reset conditioning circuit to shift an edge in time of a reset signal to synchronize with an edge of a clock to improve circuit reliability related to reset signal propagation delay, the inserting being performed on a representation of the logic circuit, the representation being stored in a memory of the digital processing system which includes a processor which performs the inserting, wherein the reset conditioning circuit receiving the reset signal as an input signal, and providing a synchronous reset signal and an asynchronous reset signal as reset signal outputs, wherein the asynchronous reset signal output has the assertion edge identical to the assertion edge of the reset signal.

23. A system as in claim 22 further comprising means for replicating a portion of the reset conditioning circuit.

24. A system as in claim 22 further comprising adding a plurality of reset conditioning circuits, wherein each reset conditioning circuit corresponds to a clock domain.

25. A system as in claim 22 wherein the reset signal outputs have the de-assertion edge synchronized with a rising clock edge.

26. A system as in claim 22 wherein the synchronous reset signal output has the assertion edge synchronized with a rising clock edge.

27. A system as in claim 22 wherein the inserting is performed automatically.

28. A digital processing system to design a logic circuit, the digital processing system comprising means for inserting into the logic circuit, a reset conditioning circuit to shift an edge in time of a reset signal to synchronize with an edge of a clock to improve circuit reliability related to reset signal propagation delay, the inserting being performed on a representation of the logic circuit, the representation being stored in a memory of the digital processing system which includes a processor which performs the inserting, wherein the reset conditioning circuit receiving the reset signal as an input signal, and providing a synchronous reset signal and an asynchronous reset signal as reset signal outputs, wherein the asynchronous reset signal output is longer than the reset signal by a predetermined number of clock cycles, wherein the reset signal outputs have the de-assertion edge synchronized with a rising clock edge, and replicating a portion of the reset conditioning circuit to duplicate the synchronous reset signal.

29. A system as in claim 28 further comprising adding a plurality of reset conditioning circuits, wherein each reset conditioning circuit corresponds to a clock domain.

30. A system as in claim 28 wherein the synchronous reset signal output has the assertion edge synchronized with a rising clock edge.

* * * * *